US012730019B2

(12) United States Patent
Messick et al.

(10) Patent No.: US 12,730,019 B2
(45) Date of Patent: Sep. 8, 2026

(54) SERVER RACK APPARATUS WITH STRUT AND STRAIN GAUGE

(71) Applicant: Dell Products L.P., Round Rock, TX (US)

(72) Inventors: Douglas E. Messick, Austin, TX (US); Sean P. O'Donnell, Poughkeepsie, NY (US); Daniel Alvarado, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 306 days.

(21) Appl. No.: 18/411,074

(22) Filed: Jan. 12, 2024

(65) Prior Publication Data

US 2025/0231071 A1 Jul. 17, 2025

(51) Int. Cl.

| | |
|---|---|
| ***G01L 1/22*** | (2006.01) |
| ***G01K 1/14*** | (2021.01) |
| ***G01M 1/00*** | (2006.01) |
| ***G01V 1/16*** | (2006.01) |
| ***H05K 7/20*** | (2006.01) |

(52) U.S. Cl.

CPC .............. *G01L 1/2206* (2013.01); *G01K 1/14* (2013.01); *G01V 1/16* (2013.01); *H05K 7/20781* (2013.01)

(58) Field of Classification Search

CPC ........... G01L 1/00; G01L 1/22; G01L 1/2206; G01M 1/00; G01K 1/14; G01V 1/16

See application file for complete search history.

(56) References Cited

U.S. PATENT DOCUMENTS

| | | | | |
|---|---|---|---|---|
| 8,724,329 | B2 * | 5/2014 | Chuang | H05K 7/1487 312/223.2 |
| 9,310,784 | B1 * | 4/2016 | Roy | H05K 7/20709 |
| 10,314,196 | B2 * | 6/2019 | Chen | H05K 7/183 |
| 11,085,809 | B1 * | 8/2021 | Franklin | G01G 3/1402 |
| 11,703,924 | B2 | 7/2023 | Ahmed et al. | |
| 2008/0135705 | A1 * | 6/2008 | Chuang | H05K 7/1489 248/243 |

FOREIGN PATENT DOCUMENTS

| | | | |
|---|---|---|---|
| CN | 220187755 U * | 12/2023 | G01D 21/02 |

OTHER PUBLICATIONS

Machine Translation of CN-220187755-U (Year: 2023).*

Glenn Charest, et al., "Open Rack V3 Base Specification," Revision 1.0, OPEN Compute Project, Aug. 24, 2022, pp. 1-27.

* cited by examiner

*Primary Examiner* — Nguyen Q. Ha

(74) *Attorney, Agent, or Firm* — Fogarty LLP

(57) ABSTRACT

Systems and methods support a server rack mechanically and gather sensor data from the server rack. For instance, the system may include an apparatus having a frame that is configured to add stiffening to a server rack. On the frame may be disposed various sensors and a computing system to measure stress and strain of the server rack as well as any other appropriate characteristic. The frame may include struts having strain gauges therein, where the strain gauges provide a measurement of stress or strain. Various sensor data may be transmitted from the apparatus to a component outside of the apparatus, such as a data center monitoring application.

20 Claims, 7 Drawing Sheets

SERVER RACK APPARATUS WITH STRUT AND STRAIN GAUGE

FIELD

The present disclosure relates to server racks and more particularly to an apparatus for use with a server rack, where the apparatus includes a strut and a strain gauge.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Further, as the value and use of information continues to increase, so does the value of the physical side of computing—server computers, server racks, data centers, and the like. There is a need in the art for improved physical systems, such as to provide mechanical stability to computer systems.

SUMMARY

In various embodiments, an apparatus includes: a frame having a depth dimension, a width dimension, and a height dimension; a first strut, arranged along the depth dimension of the frame and mechanically coupled to the frame, wherein the first strut includes a strain gauge; a second strut, arranged along the depth dimension of the frame and mechanically coupled to the frame, the second strut being arranged opposite from the first strut across the width dimension; a computing system mechanically coupled to the frame, wherein the computing system includes a first electrical connection to the first strain gauge, further wherein the computing system is configured to receive information from the first strain gauge via the first electrical connection; and a communication interface coupled to the computing system and configured to communicate, outside of the frame, strain gauge measurement information with respect to the first strain gauge; wherein the computing system is arranged to fit within the depth dimension, the width dimension, and the height dimension of the frame, further wherein the frame is configured to conform to a quantity N of server rack units, wherein N is an integer greater than or equal to one.

In some embodiments, the method comprises: mechanically supporting a deployed server rack in a data center, via a frame mounted in the server rack; deforming the frame by weight of a plurality of installed computer systems mounted in the server rack, wherein the frame comprises a first strut along a depth dimension of the server rack and a second strut along the depth dimension of the server rack, wherein deforming the frame includes compressing or extending either or both of the first strut and the second strut; generating strain measurements from strain gauges in either or both of the first strut and the second strut; and transmitting the strain measurements, from a computer system disposed within the frame, to a monitoring application associated with the data center.

In some embodiments, an apparatus includes: a server rack; a chassis, including a plurality of computing devices within the chassis, wherein the chassis is mounted in the server rack; and a rack stiffener, mounted in the server rack, wherein the rack stiffener includes: a first strut, extending along a depth dimension of the rack stiffener, wherein the first strut includes a sensor configured to measure deformation of the server rack; and a computing system disposed within the rack stiffener, wherein the computing system is configured to receive sensor information from the sensor and to transmit the sensor information to an application.

BRIEF DESCRIPTION OF THE DRAWINGS

The present disclosure may be better understood, and its numerous objects, features and advantages made apparent to those skilled in the art by referencing the accompanying drawings. The use of the same reference number throughout the several figures designates a like or similar element.

FIG. 5 is an illustration of an example rack stiffener, according to various embodiments.

DETAILED DESCRIPTION

Figure 1:
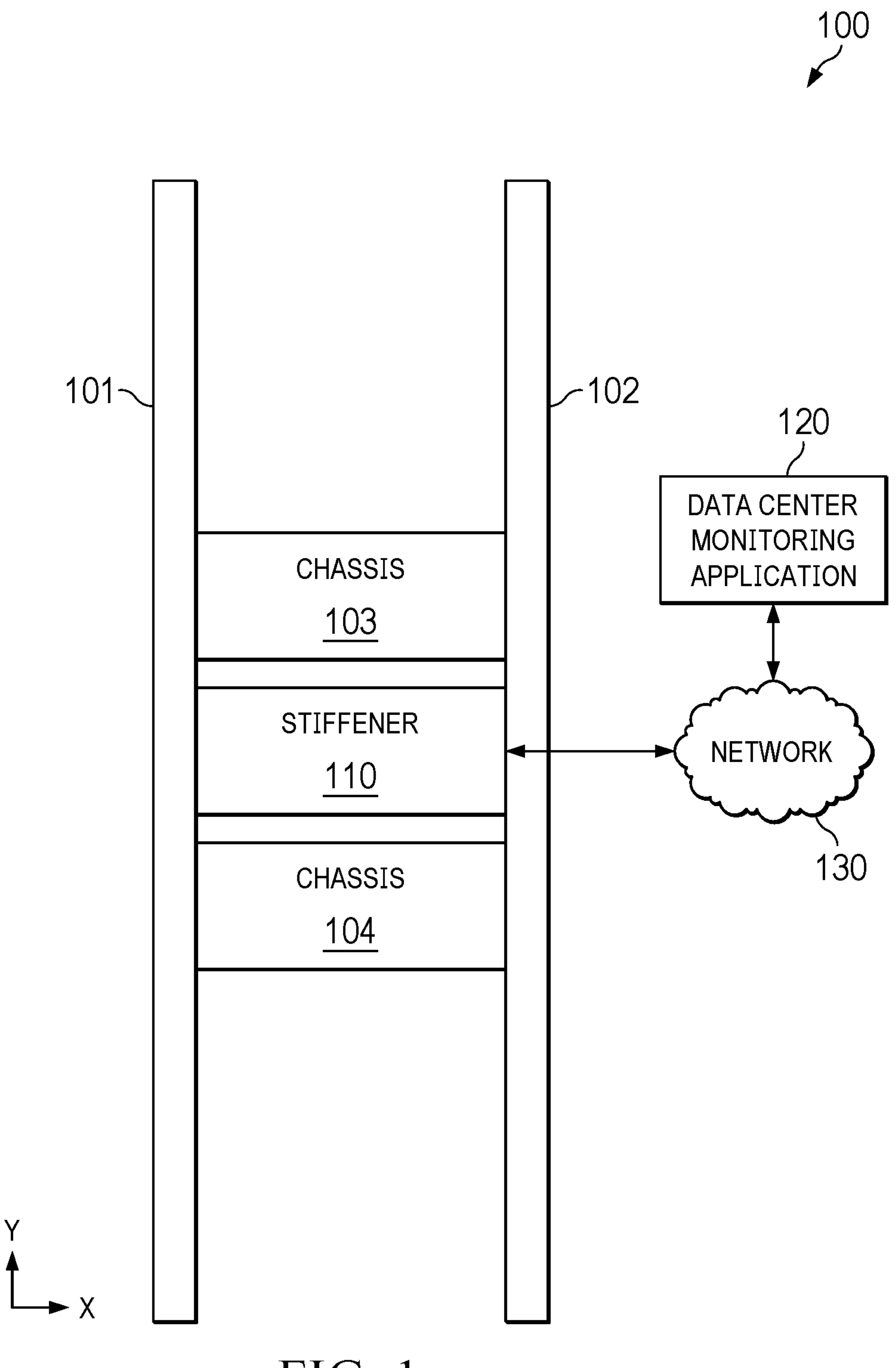
FIG. 1 is an illustration of an example computing system having a server rack, according to various embodiments.

In the following description, numerous specific details are set forth in order to provide a thorough understanding of embodiments of the present disclosure. It will be apparent to one skilled in the art that embodiments of the present disclosure may be practiced without some of these specific details. Exemplary embodiments will now be described more fully hereinafter with reference to the accompanying drawings, in which exemplary embodiments are shown. This disclosure may, however, be embodied in many different forms and should not be construed as limited to the embodiments set forth herein. These embodiments are provided so that this disclosure will be thorough and complete and will fully convey the scope of the disclosure to those of ordinary skill in the art. Moreover, all statements herein reciting embodiments of the disclosure, as well as specific examples thereof, are intended to encompass both structural and functional equivalents thereof. Additionally, it is intended that such equivalents include both currently known equivalents as well as equivalents developed in the future (i.e., any elements developed that perform the same function, regardless of structure). While embodiments of the present disclosure have been illustrated and described, the disclosure is not limited to these embodiments only. Numerous modifications, changes, variations, substitutions, and equivalents will be apparent to those skilled in the art, without departing from the scope of the disclosure, as described in the claims.

Various implementations seek to enhance mechanical stability of computing systems in a data center, such as by improving stiffness of a server rack. A current implementation of the Open Rack standard (ORv3) integrates shared infrastructure, such as a power bus bar and liquid cooling manifolds. In one example, an ORv3 server rack is 44 Open Units (OU) tall, where an OU refers to a standard portion of a rack in a height dimension. In ORv3, and OU is 48 mm.

One disadvantage of ORv3 server racks is a lack of stiffness. This has been noticed by users of deployed computing systems, where such users may mount hundreds of pounds of computer equipment in a single server rack. For instance, there is a specification for ORV3 racks that mentions a use case of 3000 pounds. The lack of stiffness may cause noticeable bowing in the vertical frame members of the server rack. There is a concern that bowing may, over time, lead to a collapse or other significant degradation of the server rack, thereby risking damage to the computing equipment mounted on the server rack. Other concerns include de-coupling of the blind mate liquid connections between the server and the liquid manifold in the rack due to bowing of the rack.

Some users of deployed computing systems have resorted to maintaining shipping braces in place. For instance, when a rack is shipped from a manufacturer to a customer, the rack may include horizontal shipping braces, where the shipping braces link parallel vertical members of the rack, thereby adding stiffness to the empty, shipped rack, during transit. Leaving shipping braces in place when the system includes mounted computer hardware may lead to increased stiffness and mechanical stability of the rack. However, the shipping braces come at a cost of one OU of space within the rack. And shipping braces are merely mechanical, adding no more than stiffness to the structure.

Various implementations include an apparatus that may be mounted within a server rack to enhance the stiffness of the server rack. Furthermore, the apparatus may include additional functionality, and thereby additional advantages, in return for use of space within the rack. In one example, the apparatus includes a frame having a depth dimension, a width dimension, and a height dimension. The depth dimension, width dimension, and height dimension may conform to a quantity N of server rack units, such as a Rack Unit (RU) according to the Electronics Industry Alliance standard, an OU, or other appropriate rack unit according to another standard or a proprietary design. The quantity N may be an integer greater than or equal to one. In other words, the apparatus may be designed to be mounted within a server rack and to use one or more rack units.

Continuing with the example, the apparatus may also include a first strut and a second strut, each of the struts arranged along the depth dimension and including a respective strain gauge. The strain gauges may be communicatively coupled to a computing system that is mechanically coupled to the frame. The computing system is configured to receive information from the strain gauges and to communicate strain gauge information outside of the frame. For instance, the computing system may include a communication interface that transmits strain gauge information wired or wirelessly. An example receiver of the strain gauge information may include a data center monitoring application, which processes and aggregates data regarding server racks in the data center.

One example may further include connectors configured to connect to a liquid cooling system of the rack. For instance, the connectors may be configured to interface with a direct liquid cooling (DLC) manifold. Furthermore, the computing system may include sensors to detect pressure, temperature, flow rate, and/or the like regarding cooling. The computing system may be configured to transmit liquid cooling sensor information to, e.g., a data center monitoring application.

Another example may include an electrical sensor configured to couple to a power busbar connection of the server rack. The electrical sensor may sense voltage, current, power, temperature, and/or the like. The computing system may be configured to receive electrical sensor information and to transmit electrical sensor information to, e.g., a data center monitoring application.

Yet another example may include an ambient temperature sensor. The computing system may receive ambient temperature sensor data and transmit ambient temperature sensor data to, e.g., a data center monitoring application.

Various implementations may provide advantages over prior solutions. For instance, various implementations may provide stiffness to enhance mechanical stability of the server rack. In addition to offering additional stiffness, various implementations may provide further functionality, such as DLC monitoring, power bus monitoring, ambient temperature monitoring, mechanical deformation monitoring via strain gauges, and the like. Such monitoring may be useful to a data center administrator, who may be tasked with maintaining operability of various computing systems. For instance, the data center administrator may use a data center monitoring application, which aggregates and processes the monitoring information described above.

Such information may allow the data center administrator to intervene when the monitoring information indicates an undesired occurrence. For instance, the strain gauges may indicate mechanical bowing, and the data center administrator may react by reducing a weight of computing systems mounted within the server rack, adding additional stiffness, or other appropriate action. DLC monitoring, temperature monitoring, and power monitoring may offer further opportunities for a data center administrator to intervene in response to undesired events, thereby decreasing downtime of computer systems as well as decreasing the potential for damage to systems from mechanical collapse or other malfunction.

FIG. 1 is an illustration of an example computer system 100, according to various embodiments. The illustration of FIG. 1 views computer system 100 according to a width dimension and a height dimension, labeled as X and Y, respectively.

Computing system 100 includes a server rack, which includes vertical member 101 and vertical member 102. Chassis 103, 104 are mounted in the server rack. For instance, mounting in the server rack may include being supported by rails (not shown) in the depth dimension and fastened using bolts or other appropriate fasteners. The server rack that includes vertical members 101, 102 may conform to any design, such as ORv3, standard rack units, or other standard or proprietary designs. The chassis 103, 104 may conform to an integer number of rack units, such as 1 OU or RU, 2 OU or RU, or the like. In fact, the chassis 103, 104 may be any appropriate size configured to fit within the server rack. An example chassis is described in more detail with respect to FIG. 2.

Stiffener 110 is also mounted in the rack. For instance, as noted above, the rack may include rails (not shown) that are mechanically coupled to the vertical members 101, 102, and the stiffener 110 may be supported by those rails and perhaps fastened onto the server rack. Furthermore, the stiffener 110 may conform to an integer number of rack units. An example stiffener is shown and described in more detail with respect to FIGS. 3-5.

The illustration of FIG. 1 is offered to show that a computer system including a server rack may include multiple chassis as well as at least one stiffener. In a server rack having, e.g., 44 OU capacity, an example computer system may have 10 or more chassis mounted therein and may have one or more stiffeners mounted therein as appropriate. The same is true over various embodiments—that a given server rack may include one or multiple chassis and one or multiple stiffeners as is appropriate for a given application.

Furthermore, computer system 100 may be disposed within a data center, where the data center includes multiple other computer systems having multiple other racks. The data center may include a data center monitoring application 120, which may include computer executable code, which is executed on a computing system in the data center or outside of the data center. The data center monitoring application 120 may include functionality to communicate with the stiffener 110 over network 130 to, e.g., gather monitoring information from the stiffener 110 and, perhaps, from other stiffeners (not shown) in other computer systems (not shown) in the data center. An administrator may use the data center monitoring application 120 to provide insight into the functioning and malfunctioning of the computer system 100. Examples of characteristics that may be monitored by the stiffener 110 and then communicated to the data center monitoring application 120 are described in more detail with respect to FIGS. 4-6.

Figure 2:
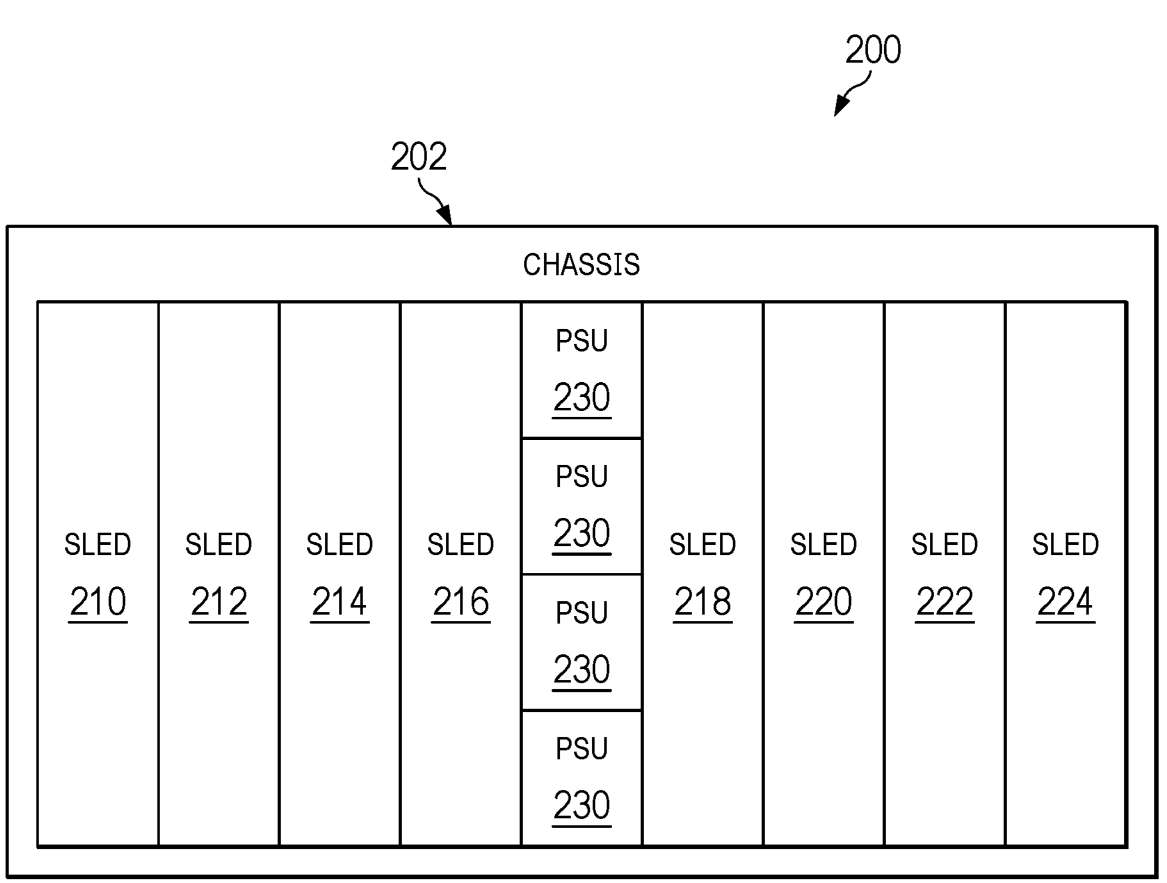
FIG. 2 is an illustration of an example chassis, which may be included within the example computer system of FIG. 1, according to various embodiments.

FIG. 2 illustrates an information handling system 200 according to various embodiments. Information handling system 200 includes a chassis 202, multiple sleds 210, 212, 214, 216, 218, 220, 222, and 224 (sleds 210-224), and multiple power supply units (PSUs) 230. Sleds 210-224 may be any suitable component within a slot of chassis 202. For example, a sled may be a single wide sled, a double wide sled, a blank sled, or the like. PSUs 230 may provide power to each of sleds 210-224. In an example, information handling system 200 may include additional components over those shown in FIG. 2 without varying from the scope of the disclosure. Chassis 202 is an example implementation of either or both of chassis 103, 104 of FIG. 1. However, the scope of implementations is not limited to any particular chassis size or types of components.

The sleds 210-224 within chassis 202 may be arranged in any appropriate manner. For instance, an amount of cooling airflow for each of sleds 210-224 may be based on an amount of power consumed by processors within the sled. For example, one of sleds 210-224 may include multiple processors rated between two hundred and three hundred Watts, which may need more cooling airflow than another sled that only includes fifty to one-hundred Watts processors. In an example, sleds 210-224 may include different airflow impedances. In certain examples, an airflow impedance of a particular sled of sleds 210-224 may be based on any suitable number of factors including, but not limited to, the components included within the sled. For example, sled 210 may include a particular number of hard drives, and sled 212 may include lower number of hard drives. In this example, sled 210 may have a higher airflow impedance as compared to sled 212 based on the higher number of hard drives in sled 210 blocking a larger amount of airflow as compared to sled 212. Sled 210 may receive a lesser amount of airflow based both on the airflow impedance of sled 210 and the airflow impedance of the adjacent sled 212.

Of course, airflow may give rise to cooling and temperature characteristics, which are examples of characteristics that may be monitored in some embodiments by stiffener 110 of FIG. 1. As described below in more detail with respect to FIG. 6, stiffener 110 may include an ambient temperature sensor and one or more sensors for liquid cooling. Data from such sensors may be aggregated and processed by data center monitoring application 120. Data center monitoring application 120 may present information to a data center administrator, the information being based at least in part on data from various sensors, and the data center administrator may then be given an opportunity to intervene if appropriate.

Figure 3:
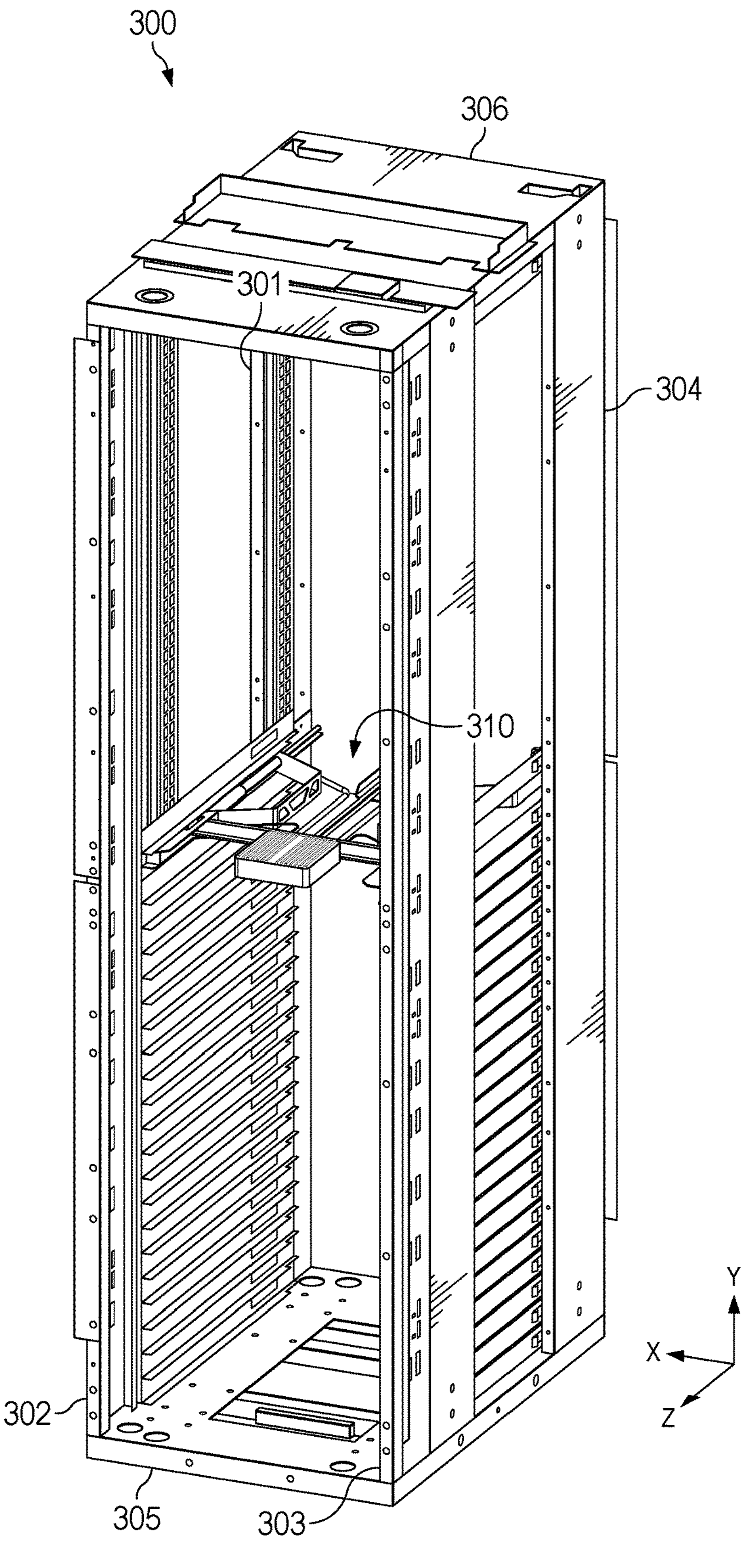
FIG. 3 is an illustration of an example server rack including an example rack stiffener, according to various embodiments.

FIG. 3 is an illustration of an example server rack 300, according to various embodiments. Server rack 300 may conform to any appropriate standard or proprietary design and, in particular, may conform to ORv3. The scope of implementations is not limited to any standard or proprietary design, as the example stiffener 310 may be adapted for use in any appropriate server rack. Stiffener 310 illustrates an exemplary implementation of stiffener 110 of FIG. 1, and server rack 300 illustrates an exemplary implementation of the server rack of FIG. 1.

The example illustrates a height dimension (Y), a width dimension (X), and a depth dimension (Z). The vertical members 301-304 extend in the height dimension from the base 305 to the canopy 306. Stiffener 310 is mounted within server rack 300 by, e.g., being slid into the rack 300 along the depth dimension and being supported by rails (obstructed in this view). The stiffener 310 may further be fastened to the server rack using, e.g., bolts or other appropriate fasteners in a same or similar manner as chassis would be mounted in server rack 300. Although no chassis are shown in FIG. 3, that is for case of illustration to show stiffener 310 without obstruction. However, it is understood that one or multiple chassis may be mounted within server rack 300, such as is illustrated in FIG. 1.

Figure 4:
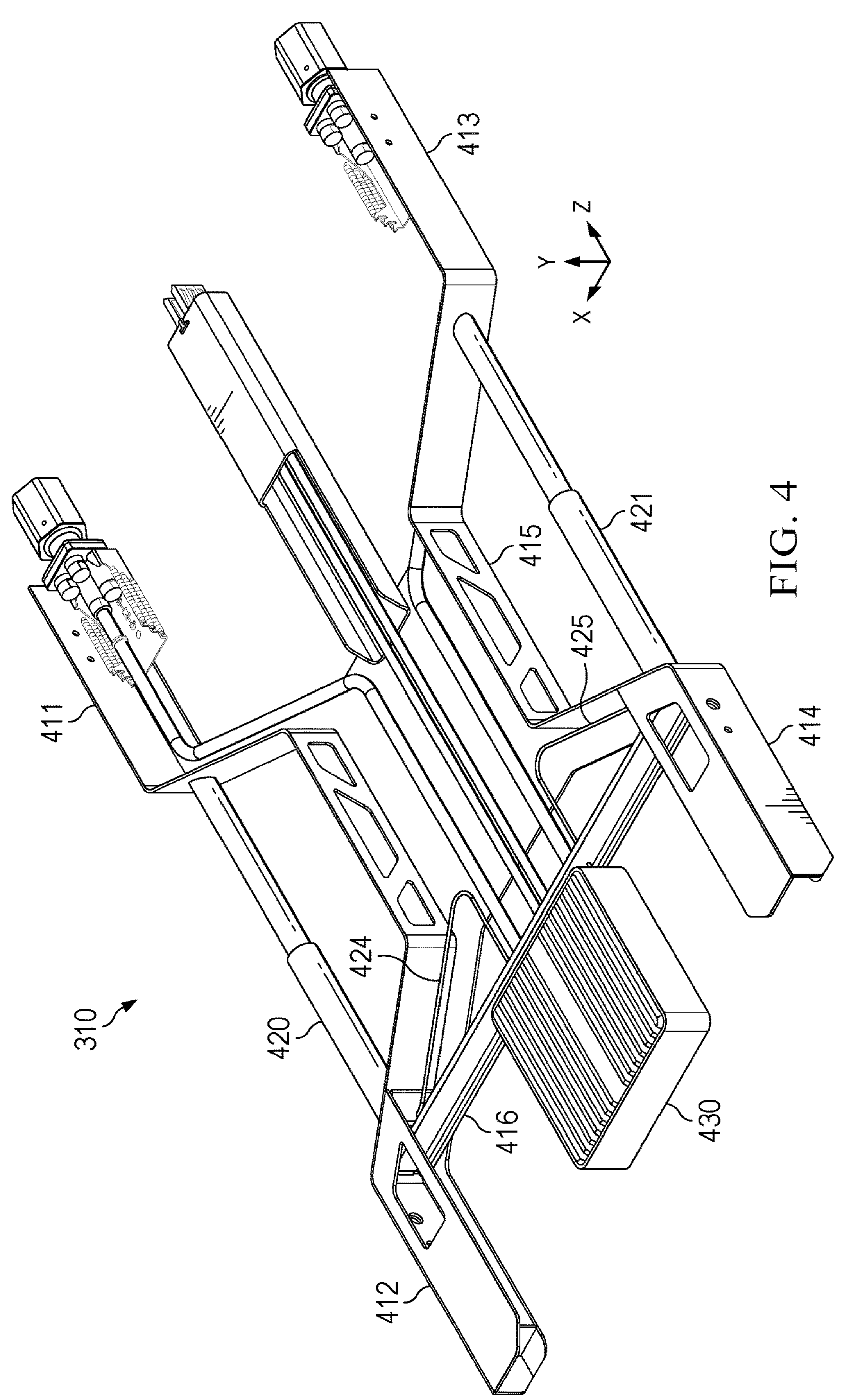
FIG. 4 is an illustration of an example rack stiffener, according to various embodiments.
Figure 5:
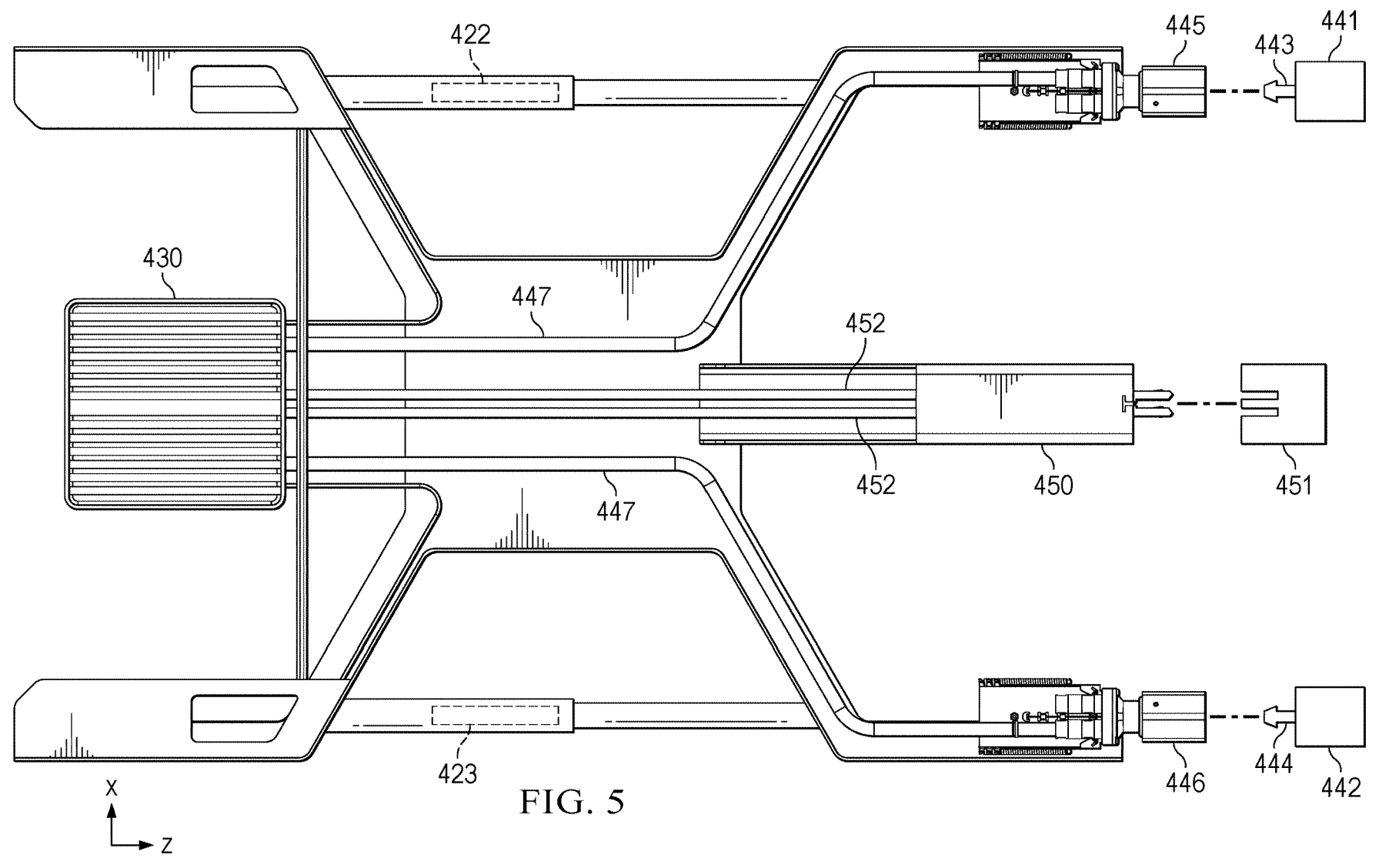

FIG. 4 is an illustration of a specific implementation of example stiffener 310, according to various embodiments. FIG. 5 is an illustration of the implementation that is also illustrated in FIG. 4, though it is from a different vantage point in FIG. 5.

Example stiffener 310 includes a frame having four arms 411-414 and a central rectangular portion 415. The arms are arranged in an "x" shape in this example, with the arms 411-414 being the arms of the x, and the arms 411-414 extend outward from the central rectangular portion 415. Crossmember 416 extends in the width dimension from arm 412 to arm 414 and is mechanically coupled to arms 412, 414 by any appropriate technique, such as by welding, adhesive, or fasteners. In this example, the frame is constructed of folded metal, such as steel or aluminum. However, the scope of implementations is not limited to any particular material, as other materials may be used, such as carbon fiber composite, various plastics, and the like.

Stiffener 310 is configured to occupy one OU within the server rack. However, the scope of implementations may include scaling stiffener 310 to occupy more than one OU if appropriate.

Strut 420 is mechanically coupled to the frame, and it extends along the depth dimension. Similarly, strut 421 is mechanically coupled to the frame and extends along the depth dimension. Struts 420, 421 may be implemented in any appropriate manner, such as being spring-loaded, gas loaded, and/or the like.

Strut 420 includes strain gauge 422, and strut 421 includes strain gauge 423. Strain gauges 422, 423 generate information, either analog or digital, indicative of a stress or a strain experienced by a respective strut. Strain gauges 422, 423 transmit the strain gauge measurement information via wires 424, 425 to computing system 430. Computing system 430 is mechanically coupled to crossmember 416 and is described in more detail with respect to FIG. 6.

In the present example, the server rack includes a DLC system, where a first cooling manifold 441 extends vertically along vertical member 301 and a second cooling manifold 442 extends vertically along vertical member 304. Example cooling manifolds 441, 442 are shown in a top-down view in FIG. 5. Stiffener 310 includes female DLC connectors 445, 446 configured to connect to the cooling manifolds 441, 442 via male connectors 443, 444 respectively. Although not shown in FIG. 5, it is understood that each of the cooling manifolds 441, 442 may include a set of male connectors for any given rack unit along the height of the rack. Furthermore, the particular connectors 444-446 are for example only, and the scope of implementations may be adapted to use any appropriate liquid cooling connector.

The connectors 445, 446 are coupled to liquid cooling line 447, which is routed through computing system 430. Computing system 430 may include one or more sensors that are configured to sense characteristics of the liquid cooling system, such as temperature, pressure, flow, and the like. Although not shown in FIG. 5, computing system 430 may include any appropriate sensor additionally or alternatively, such as a seismic sensor, and ambient temperature sensor, and/or the like.

Stiffener 310 further includes busbar connection 450. Although not shown in FIG. 3, the server rack may include an electrical busbar configured to provide power to any chassis mounted within the rack. FIG. 5 shows a top-down view of busbar 451, and it is understood that busbar 451 may include capability to electrically couple to any chassis along the vertical extent of the rack. In the present example, the busbar connector 450 is a male connector, and it connects to the female connector of the busbar 451. Electrical wires 452 provide an electrical connection between busbar 451 and computing system 430. Computing system 430 may rely upon busbar 451 for its power. Additionally, computing system 430 may include at least one electrical sensor in communication with the busbar connection 450, where the electrical sensor may sense characteristics, such as voltage, current, power, temperature, and/or the like.

Figure 6:
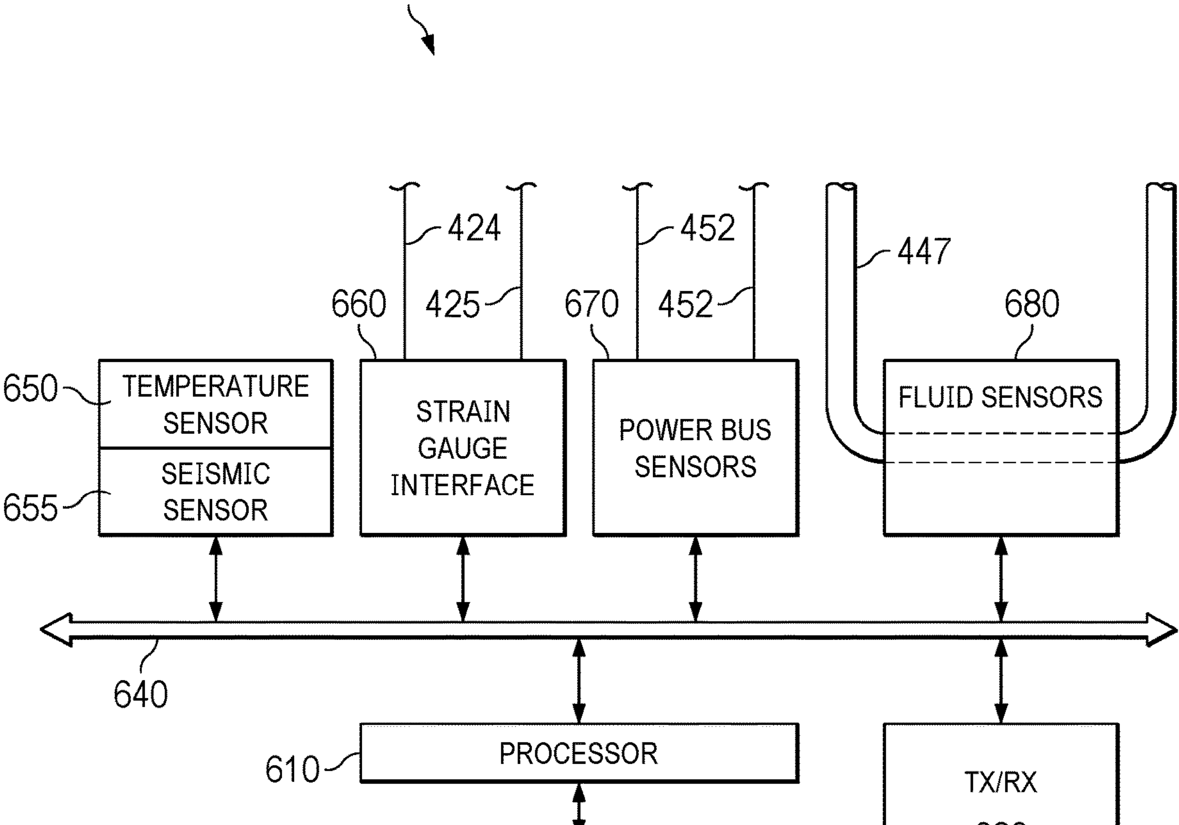
FIG. 6 is an illustration of an example computing system, which may be included in the rack stiffener, according to various embodiments.

FIG. 6 is an illustration of an example implementation of computing system 430, according to various embodiments. Computing system 430 includes processor 610, which is coupled to a memory 620 and a transceiver 630. The processor 610 may include any appropriate processing circuit, such as a microprocessor, a microcontroller, an application-specific integrated circuit (ASIC), a field-programmable gate array (FPGA) or other type of processing circuitry, as well as portions or combinations of such circuitry elements.

The memory 620 may include random access memory (RAM), read-only memory (ROM), or other types of memory, in any combination. The memory 620 and other memories disclosed herein may be viewed as examples of what are more generally referred to as "computer-readable storage media" storing executable computer program code or other types of software programs.

The memory 620 may be used to store sensor data received from the various sensors as well as to store computer-readable instructions to be executed by processor 610. Processor 610 may execute the computer-readable instructions to provide the functionality described herein.

Processor 610 is in communication with bus 640, as are the various sensors 650-680 and the transceiver 630. Processor 610 may communicate with the various sensors 650-680 and with the transceiver 630 by employing bus 640.

Continuing with the example, computing system 430 includes ambient temperature sensor 650, which may be used to generate ambient temperature information. Ambient temperature sensor 650 may be in addition to temperature sensors that may be implemented to measure temperatures with respect to the power bus and/or the liquid cooling system. Processor 610 may be in communication with the ambient temperature sensor 650 to receive ambient temperature measurement information.

Computing system 430 may also include seismic sensor 655. Seismic sensor 655 may measure any kind of movement of the stiffener 310, such as movement that may be associated with earthquakes or other forms of geologic motion. Processor 610 may be in communication with the seismic sensor 655 to receive seismic measurement information.

Computing system 430 may also include strain gauge interface 660. Strain gauge interface 660 may communicate with the strain gauges 422, 423 by wires 424 and 425 to receive strain gauge sensor information. Processor 610 may be in communication with the strain gauge interface 660 by employing bus 640 and may receive information regarding stress or strain therefrom.

Computing system 430 may further include power bus sensors 670. The power bus sensor7 670 may measure voltage between the wires 452, may measure current through the wires 452, may measure power, may measure temperature of the wires 452, and/or the like. The power bus sensors 670 may generate electrical sensor information and transmit that electrical sensor information to the processor 610 through bus 640.

Computer system 430 may also include fluid sensors 680, which couple to liquid cooling line 447. For instance, liquid cooling line 447 may pass liquid coolant from one cooling manifold to the other, and that coolant may flow through cooling line 447, where characteristics of the coolant may be measured by the fluid sensors 680. For instance, fluid sensors 680 may generate temperature sensor information of the fluid, flow rate information of the fluid, pressure information of the fluid, and/or the like. The fluid sensors 680 may transmit that fluid sensor information to the processor 610 through bus 640.

The processor 610 may receive sensor information from sensors 650-680 and perform any appropriate processing. For instance, processor 610 may convert analog information to digital information when appropriate, put the information into packets, and transmit the packets outside of the server rack to a data center monitoring application 120 via transceiver 630 and network 130 (FIG. 1). The network 130 may include a portion of a global computer network such as the Internet, although other types of networks can be part of the computer network 130, including a wide area network (WAN), a local area network (LAN), a satellite network, a telephone or cable network, a cellular network, a wireless network such as a Wi-Fi or 5G network, or various portions or combinations of these and other types of networks. The computer network 130 in some embodiments therefore may include combinations of multiple different types of networks, each including processing devices configured to communicate using internet protocol (IP) or other related communication protocols. The information may be transmitted wired or wirelessly.

Figure 7:
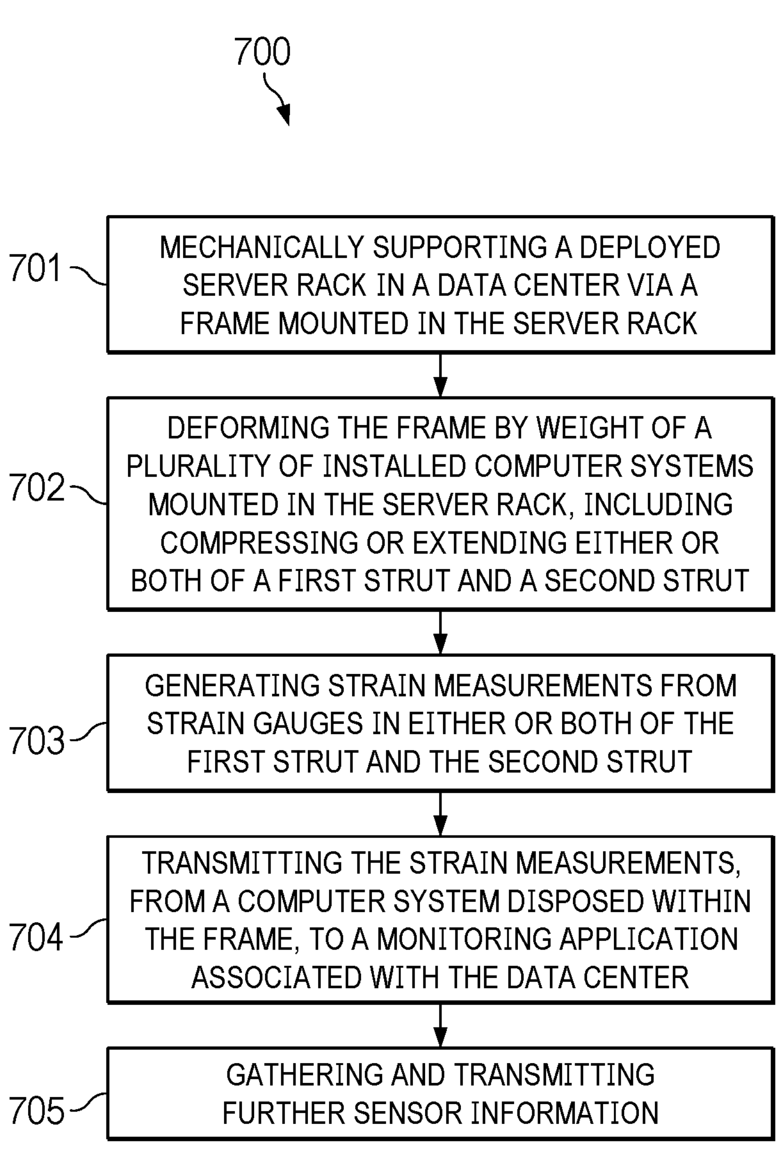
FIG. 7 is an illustration of an example method of strengthening a server rack as well as gathering and transmitting sensor information of the server rack, according to various embodiments.

FIG. 7 is an illustration of an example method 700 for supporting a server rack and gathering and transmitting sensor information, according to various embodiments. The actions of method 700 may be performed by a rack stiffener having struts, strain gauges, other sensors, and a computing device that executes computer-readable instructions to provide functionality. In one example, method 700 may be performed by a rack stiffener, such as rack stiffener 110 or rack stiffener 310.

At action 701, the rack stiffener mechanically supports a deployed server rack in a data center. For instance, the rack stiffener may include a frame that is mounted in the server rack. The server rack is deployed and in use, so the server rack may further include one or more chassis mounted in the server rack in addition to the stiffener being mounted in the server rack.

In the examples of FIGS. 3-5, rack stiffener 310 includes a frame that has arms 411-414 extending from a rectangular piece 415 in the center of the frame. The frame may also include a crossmember 416 and struts 420, 421. Together, the various components of the rack stiffener 310 provide stiffening when mounted to the server rack. For instance, the mounting may include fastening the rack stiffener via bolts or other appropriate fastener to the server rack so that the deformation of the vertical members of the server rack may be felt as stress or strain by the frame and its struts. Furthermore, the stiffness provided by the stiffener may serve to reduce deformation of the server rack, thereby increasing structural integrity.

At action 702, the stiffener is deformed by the weight of a plurality of installed computer systems mounted in the server rack. For instance, there may be one or more chassis mounted in the server rack above and/or below the rack stiffener, such as is illustrated in FIG. 1. In fact, other computer systems may be installed in the rack so as to use all or nearly all of the rack units, thereby adding hundreds of pounds of weight to be supported by the rack.

The deformation of the frame may include compressing or extending either or both of the struts, such as struts 420, 421. The deformation of the frame may be caused by bowing or other movement experienced by vertical members of the server rack.

At action 703, the stiffener generates strain measurements from strain gauges in either or both of the first strut and the second strut. For instance, the strain gauges may generate voltage or current proportional to an amount of strain or stress, where that voltage or current may be converted into a digital signal by for instance strain gauge interface 660 and/or processor 610. In yet another embodiment, the strain gauges themselves may generate digital data to transmit to the processor 610.

Action 703 may further include the processor processing or storing the strain gauge measurement data. For instance, the processor 610 may process the information in any appropriate manner and may store the information in memory 620.

At action 704, the computing system 430 of the stiffener may transmit the strain measurements. For instance, the computing system 430 may include a transceiver, such as transceiver 630 configured to transmit the strain measurements to a monitoring application associated with the data center. In one example, the computing system 430 may transmit the strain measurements to a data center monitoring application, such as application 120 of FIG. 1.

At action 705, the computing system 430 gathers and transmits further sensor information. For instance, in the examples of FIGS. 3-6, the stiffener includes other sensors, such as a seismic sensor, an ambient temperature sensor, electrical sensors, fluid sensors, and the like. In fact, the scope of embodiments is not limited to any particular sensors as other sensors may be used instead of or in addition to the sensors mentioned above. Action 705 may include the processor 610 gathering sensor data from the various sensors 650-680 and providing that sensor data to a data center monitoring application.

Of course, the scope of implementations is not limited to transmitting data from any particular sensor in any particular order. For instance, actions 704 and 705 may be performed together, such that various sensor data may be aggregated into packets and sent in those packets to the data center monitoring application. Furthermore, actions 701-702 may be performed continually over time, and actions 703-705 may be performed repeatedly over time as appropriate.

It should be understood that various operations described herein may be implemented in software executed by logic or processing circuitry, hardware, or a combination thereof. The order in which each operation of a given method is performed may be changed, and various operations may be added, reordered, combined, omitted, modified, etc. It is intended that the implementation(s) described herein embrace all such modifications and changes and, accordingly, the above description should be regarded in an illustrative rather than a restrictive sense.

Although the implementation(s) is/are described herein with reference to specific embodiments, various modifications and changes can be made without departing from the scope of the present implementation(s), as set forth in the claims below. Accordingly, the specification and figures are to be regarded in an illustrative rather than a restrictive sense, and all such modifications are intended to be included within the scope of the present implementation(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises,"

"has," "includes" or "contains" one or more operations possesses those one or more operations but is not limited to possessing only those one or more operations.

The invention claimed is:

1. An apparatus comprising:

a frame having a depth dimension, a width dimension, and a height dimension;

a first strut, arranged along the depth dimension of the frame and mechanically coupled to the frame, wherein the first strut includes a first strain gauge;

a second strut, arranged along the depth dimension of the frame and mechanically coupled to the frame, the second strut being arranged opposite from the first strut across the width dimension;

a computing system mechanically coupled to the frame, wherein the computing system includes a first electrical connection to the first strain gauge, further wherein the computing system is configured to receive information from the first strain gauge via the first electrical connection; and a communication interface coupled to the computing system and configured to communicate, outside of the frame, strain gauge measurement information with respect to the first strain gauge;

wherein the computing system is arranged to fit within the depth dimension, the width dimension, and the height dimension of the frame, further wherein the frame is configured to conform to a quantity N of server rack units, wherein N is an integer greater than or equal to one, wherein the frame has a first portion constructed using a single piece of folded metal in an X shape, further wherein the frame includes a crossmember extending along the width dimension and coupled to the first portion.

2. The apparatus of claim 1, wherein the frame is configured to conform to 1 open unit (OU), according to an Open Rack standard.

3. The apparatus of claim 1, wherein the frame is configured to conform to 1 rack unit (RU) according to an Electronics Industry Alliance standard.

4. The apparatus of claim 1, wherein the first portion of the frame includes four arms extending from a center portion, wherein the first strut extends between a first arm and a second arm, and wherein the second strut extends between a third arm and a fourth arm.

5. The apparatus of claim 4, further wherein the crossmember extends between the second arm and the fourth arm.

6. The apparatus of claim 1, further including:

a seismic sensor in communication with the computing system, wherein the communication interface is configured to communicate, outside of the frame, seismic measurement information with respect to the seismic sensor.

7. The apparatus of claim 1, further including:

a second strain gauge included in the second strut;

a second electrical connection to the second strain gauge, further wherein the computing system is configured to receive information from the second strain gauge via the second electrical connection, and wherein the communication interface is configured to communicate, outside of the frame, strain gauge measurement information with respect to the second strain gauge.

8. The apparatus of claim 1, further including an ambient temperature sensor in communication with the computing system, further wherein the communication interface is configured to communicate, outside of the frame, ambient temperature information with respect to the ambient temperature sensor.

9. An apparatus comprising:

a frame having a depth dimension, a width dimension, and a height dimension;

a first strut, arranged along the depth dimension of the frame and mechanically coupled to the frame, wherein the first strut includes a first strain gauge;

a second strut, arranged along the depth dimension of the frame and mechanically coupled to the frame, the second strut being arranged opposite from the first strut across the width dimension;

a computing system mechanically coupled to the frame, wherein the computing system includes a first electrical connection to the first strain gauge, further wherein the computing system is configured to receive information from the first strain gauge via the first electrical connection;

a communication interface coupled to the computing system and configured to communicate, outside of the frame, strain gauge measurement information with respect to the first strain gauge;

wherein the computing system is arranged to fit within the depth dimension, the width dimension, and the height dimension of the frame, further wherein the frame is configured to conform to a quantity N of server rack units, wherein N is an integer greater than or equal to one;

a first connector configured to connect to a liquid cooling system, and a second connector configured to connect to the liquid cooling system; and a liquid cooling line coupled to the first connector, the second connector, and a first sensor of the computing system, further wherein the communication interface is configured to communicate, outside of the frame, at least one of pressure, temperature, or flow rate of a liquid coolant within the liquid cooling line.

10. An apparatus comprising:

a frame having a depth dimension, a width dimension, and a height dimension;

a first strut, arranged along the depth dimension of the frame and mechanically coupled to the frame, wherein the first strut includes a first strain gauge;

a second strut, arranged along the depth dimension of the frame and mechanically coupled to the frame, the second strut being arranged opposite from the first strut across the width dimension;

a computing system mechanically coupled to the frame, wherein the computing system includes a first electrical connection to the first strain gauge, further wherein the computing system is configured to receive information from the first strain gauge via the first electrical connection;

a communication interface coupled to the computing system and configured to communicate, outside of the frame, strain gauge measurement information with respect to the first strain gauge;

wherein the computing system is arranged to fit within the depth dimension, the width dimension, and the height dimension of the frame, further wherein the frame is configured to conform to a quantity N of server rack units, wherein N is an integer greater than or equal to one;

a busbar connection, configured to electrically interface with a busbar of a server rack; and, an electrical sensor in communication with the busbar connection, further wherein the communication interface is configured to communicate, outside of the frame, electrical sensor information with respect to the electrical sensor.

11. The apparatus of claim 10, further including a temperature measurement sensor in communication with the busbar connection, further wherein the communication interface is configured to communicate, outside of the frame, temperature information with respect to the temperature measurement sensor.

12. A method comprising:

mechanically supporting a deployed server rack in a data center, via a frame mounted in the server rack;

deforming the frame by weight of a plurality of installed computer systems mounted in the server rack, wherein the frame comprises a first strut along a depth dimension of the server rack and a second strut along the depth dimension of the server rack, wherein deforming the frame includes compressing or extending either or both of the first strut and the second strut;

generating strain measurements from strain gauges in either or both of the first strut and the second strut;

transmitting the strain measurements, from a computer system disposed within the frame, to a monitoring application associated with the data center;

measuring a characteristic of a liquid cooling system by a sensor disposed within the frame; and transmitting measurements of the characteristic of the liquid cooling system, from the computer system disposed within the frame, to the monitoring application.

13. The method of claim 12, wherein the frame is mounted to a plurality of rails, wherein the plurality of rails are mechanically coupled to the server rack.

14. The method of claim 12, further comprising:

measuring an ambient temperature by a temperature sensor disposed within the frame; and transmitting an ambient temperature measurement, associated with the temperature sensor, from the computing system disposed within the frame to the monitoring application.

15. A method comprising:

mechanically supporting a deployed server rack in a data center, via a frame mounted in the server rack;

deforming the frame by weight of a plurality of installed computer systems mounted in the server rack, wherein the frame comprises a first strut along a depth dimension of the server rack and a second strut along the depth dimension of the server rack, wherein deforming the frame includes compressing or extending either or both of the first strut and the second strut;

generating strain measurements from strain gauges in either or both of the first strut and the second strut;

transmitting the strain measurements, from a computer system disposed within the frame, to a monitoring application associated with the data center;

measuring a characteristic of a busbar of the server rack by a sensor disposed within the frame; and transmitting measurements of the characteristic of the busbar, from the computer system disposed within the frame, to the monitoring application.

16. An apparatus comprising:

a server rack;

a chassis, including a plurality of computing devices within the chassis, wherein the chassis is mounted in the server rack; and a rack stiffener, mounted in the server rack, wherein the rack stiffener includes:

a first strut, extending along a depth dimension of the rack stiffener, wherein the first strut includes a sensor configured to measure deformation of the server rack; and a computing system disposed within the rack stiffener, wherein the computing system is configured to receive sensor information from the sensor and to transmit the sensor information to an application, wherein the rack stiffener comprises four arms extending outwardly from a center portion, wherein the first strut extends between a first arm and a second arm, and wherein a second strut extends between a third arm and a fourth arm, further wherein the rack stiffener includes a crossmember mechanically coupling the second arm to the third arm.

17. The apparatus of claim 16, wherein the rack stiffener conforms to a single rack unit of the server rack.

18. The apparatus of claim 16, wherein the rack stiffener further includes:

a seismic sensor in communication with the computing system, wherein the computing system is configured to communicate, outside of the frame, seismic measurement information with respect to the seismic sensor.

19. The apparatus of claim 16, wherein the rack stiffener further includes:

a busbar connection, configured to electrically interface with a busbar of the server rack; and a temperature measurement sensor in communication with the busbar connection, further wherein the computing system is configured to communicate, outside of the frame, temperature information with respect to the temperature measurement sensor.

20. The apparatus of claim 16, wherein the rack stiffener further includes:

an ambient temperature sensor in communication with the computing system, further wherein the computing system is configured to communicate, outside of the frame, ambient temperature information with respect to the ambient temperature sensor.

* * * * *